(12) United States Patent
Eickbush et al.

(10) Patent No.: US 12,342,477 B2
(45) Date of Patent: *Jun. 24, 2025

(54) ELECTRONICS MODULE WITH RACEWAY AND SUBMODULES

(71) Applicant: Honeywell Federal Manufacturing & Technologies, LLC, Kansas City, MO (US)

(72) Inventors: Ryan J. Eickbush, Grandview, MO (US); Neiko P. Levenhagen, Lee's Summit, MO (US); Christopher Scott Marchman, Overland Park, KS (US); Steven Patterson, Kansas City, MO (US); Nicholas J. Furman, Overland Park, KS (US)

(73) Assignee: Honeywell Federal Manufacturing & Technologies, LLC, Kansas City, MO (US)

( * ) Notice: Subject to any disclaimer, the term of this patent is extended or adjusted under 35 U.S.C. 154(b) by 8 days.

This patent is subject to a terminal disclaimer.

(21) Appl. No.: 18/429,607

(22) Filed: Feb. 1, 2024

(65) Prior Publication Data

US 2024/0414855 A1 Dec. 12, 2024

Related U.S. Application Data

(63) Continuation of application No. 17/698,412, filed on Mar. 18, 2022, now Pat. No. 11,924,983.

(51) Int. Cl.
*H05K 5/00* (2025.01)
*H05K 1/11* (2006.01)
*H05K 1/18* (2006.01)
*H05K 3/18* (2006.01)

(52) U.S. Cl.
CPC ........... *H05K 5/0065* (2013.01); *H05K 1/111* (2013.01); *H05K 1/181* (2013.01); *H05K 3/181* (2013.01); *H05K 2201/10106* (2013.01); *H05K 2201/10151* (2013.01); *H05K 2203/107* (2013.01)

(58) Field of Classification Search
CPC ...... H05K 5/0065; H05K 1/111; H05K 1/181; H05K 3/181; H05K 2201/10106; H05K 2201/10151; H05K 2203/107
See application file for complete search history.

(56) References Cited

U.S. PATENT DOCUMENTS

2013/0127879 A1* 5/2013 Burns ................. G01L 19/0084
29/729

* cited by examiner

*Primary Examiner* — Sherman Ng
(74) *Attorney, Agent, or Firm* — Erise IP, P.A.

(57) ABSTRACT

Systems and methods for providing an electronics module including a raceway for mounting submodules and establishing electrical communication with said submodules. The raceway comprises a base structure and a conductive trace formed by a conductive plating process. Connection pads on the raceway are configured to receive connection nodes of the submodules for providing a continuous electrical connection between the raceway and the submodules for electrical communication and power transmission.

18 Claims, 8 Drawing Sheets

ELECTRONICS MODULE WITH RACEWAY AND SUBMODULES

RELATED APPLICATION

This patent application is a continuation application claiming priority benefit, with regard to all common subject matter, of U.S. patent application Ser. No. 17/698,412, filed Mar. 18, 2022, and entitled "ELECTRONICS MODULE WITH RACEWAY AND SUBMODULES". The above-referenced application is hereby incorporated by reference in its entirety into the present application.

STATEMENT OF GOVERNMENTAL SUPPORT

This invention was made with government support under DE-NA0002839 awarded by the United States Department of Energy/National Nuclear Security Administration. The government has certain rights in the invention.

BACKGROUND

1. Field

Embodiments of the invention relate to modular electronics. More specifically, embodiments of the invention relate to manufacturing of modular electronics systems.

2. Related Art

Current testing apparatuses may be used to provide a variety of experiments by including data recording components. However, said testing apparatuses are not modular and therefore, do not allow a variety of selection in terms of types of data recording components. Further, a standardized attachment procedure for mounting said data recording components and providing electrical communication is not currently available. Additionally, present manufacturing methods do not allow rapid production and selective adjustment of testing equipment.

SUMMARY

Embodiments of the invention solve the above-mentioned problems by providing an electronics module including a raceway for mounting one or more submodules and providing electrical communication with said one or more submodules.

In some aspects, the techniques described herein relate to an electronics module including an additively manufactured raceway including a base structure, one or more conductive traces applied to the base structure by laser direct structuring followed by electroless plating, and a plurality of connection pads on the base structure, each connection pad of the plurality of connection pads including a detent portion, and one or more submodules mounted onto the raceway, each submodule of the one or more submodules including a submodule base structure, and a plurality of connection nodes disposed on a first side of the submodule base structure configured to interface with the plurality of connection pads of the raceway respectively by fitting into the detent portion of each connection pad, wherein each of the plurality of connection nodes provides a continuous electrical connection between the submodule and the respective connection pad to allow for transferring power and data.

In some aspects, the techniques described herein relate to an electronics module, further including at least one microcontroller communicatively coupled to the raceway and the one or more submodules through the one or more conductive traces.

In some aspects, the techniques described herein relate to an electronics module, wherein the at least one microcontroller includes a Universal Serial Bus (USB) connection, and wherein the at least one microcontroller is disposed on an edge of the raceway for allowing access to the USB connection.

In some aspects, the techniques described herein relate to an electronics module, further including a Secure Digital (SD) card port configured to receive an SD card for storing data collected from the one or more submodules.

In some aspects, the techniques described herein relate to an electronics module, each submodule of the one or more submodules includes one or more solderable conductive traces for mounting one or more electronic subcomponents to the respective submodule.

In some aspects, the techniques described herein relate to an electronics module, further including at least one sensor disposed on the one or more submodules, and one or more submodule conductive traces disposed on the submodule base structure of the one or more submodules for transferring information from the at least one sensor.

In some aspects, the techniques described herein relate to an electronics module, wherein the one or more submodules includes a strain gauge assembly including a strain gauge base, a cantilever beam mounted to the strain gauge base, and one or more strain gauges disposed on the strain gauge base.

In some aspects, the techniques described herein relate to an electronics module, wherein the one or more submodules includes one or more light emitting diode (LED) indicators communicatively connected to the one or more submodule conductive traces.

In some aspects, the techniques described herein relate to an electronics module, wherein the one or more submodules includes a thermocouple disposed on a breakout board, the breakout board mounted to the submodule base structure, wherein the thermocouple is communicatively connected to the one or more submodule conductive traces.

In some aspects, the techniques described herein relate to an electronics module, wherein the one or more submodules includes an accelerometer assembly mounted on the submodule base structure, the accelerometer assembly including an accelerometer housing, an accelerometer weight, and a piezo-resistive siloxane sensor for sensing an acceleration of the electronics module.

In some aspects, the techniques described herein relate to a method for manufacturing an electronics module, the method including 3D printing a base structure, applying a powder coating on an outer surface of the base structure, after application of the powder coating, applying a laser direct structuring process to the outer surface of the base structure, to define a course on the outer surface of the base structure, applying a conductive plating to the outer surface of the base structure, the conductive plating providing a conductive trace disposed on the base structure over the course defined by the laser direct structuring process, and securing one or more submodules to the base structure.

In some aspects, the techniques described herein relate to a method, wherein each submodule of the one or more submodules includes a plurality of connection nodes disposed on a first side of a submodule base structure configured to interface with the conductive trace, wherein securing each submodule to the base structure provides a continuous electrical connection between the submodule and the conductive trace to allow for transferring power and data.

In some aspects, the techniques described herein relate to a method, further including reworking a portion of the base structure to provide a surface finish.

In some aspects, the techniques described herein relate to a method, wherein the base structure includes both a polymer material and a metal material, further including combining the polymer material and the metal material before applying the powder coating.

In some aspects, the techniques described herein relate to a modular electronics system including a housing, a plurality of electronics modules within the housing, each electronics module of the plurality of electronics modules including a raceway including a base structure, one or more conductive traces on the base structure, the one or more conductive traces formed by laser direct structuring followed by electroless plating, and a plurality of connection pads disposed on the base structure, each connection pad of the plurality of connection pads including a detent portion, one or more submodules mounted onto the raceway, each submodule of the one or more submodules including a submodule base structure, and a plurality of connection nodes disposed on a first side of the submodule base structure configured to interface with the plurality of connection pads of the raceway respectively by fitting into the detent portion of each connection pad, wherein each of the plurality of connection nodes provides a continuous electrical connection between the submodule and the respective connection pad, and at least one microcontroller communicatively coupled to the plurality of electronics modules.

In some aspects, the techniques described herein relate to a modular electronics system, further including at least one power source for providing power to the plurality of electronics modules.

In some aspects, the techniques described herein relate to a modular electronics system, wherein a submodule of the one or more submodules includes an accelerometer assembly mounted on the submodule base structure, the accelerometer assembly includes an accelerometer housing, an accelerometer weight, and a piezo-resistive sensor for sensing an acceleration of the electronics module.

In some aspects, the techniques described herein relate to a modular electronics system, wherein the piezo-resistive sensor includes a 3D printed siloxane pad, wherein a displacement of the siloxane pad is proportional to the sensed acceleration.

In some aspects, the techniques described herein relate to a modular electronics system, further including an electrical connector disposed on the housing and electrically coupled to each of the plurality of electronics modules for providing communications and power to the plurality of electronics modules.

In some aspects, the techniques described herein relate to a modular electronics system, wherein at least one submodule of the one or more submodules includes one or more light emitting diode (LED) indicators, and wherein the housing is at least partially transparent such that the one or more LED indicators are visible through the housing.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the invention will be apparent from the following detailed description of the embodiments and the accompanying drawing figures.

BRIEF DESCRIPTION OF THE DRAWING FIGURES

Embodiments of the invention are described in detail below with reference to the attached drawing figures, wherein.

Figure 1:
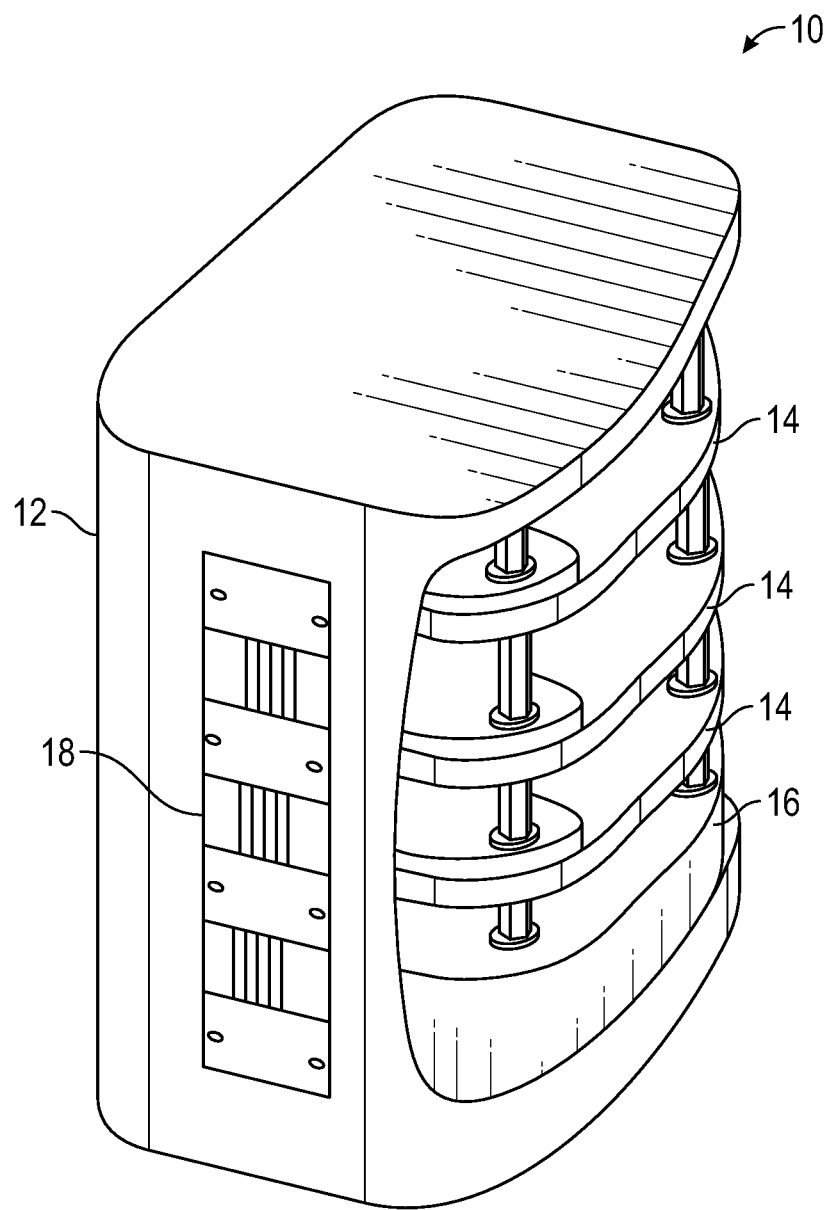
FIG. 1 depicts a cutaway view of an exemplary modular electronics system relating to some embodiments of the invention.

The drawing figures do not limit the invention to the specific embodiments disclosed and described herein. The drawings are not necessarily to scale, emphasis instead being placed upon clearly illustrating the principles of the invention.

DETAILED DESCRIPTION

The following detailed description references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the invention. The following detailed description is, therefore, not to be taken in a limiting sense. The scope of the invention is defined only by the appended claims, along with the full scope of equivalents to which such claims are entitled.

In this description, references to "one embodiment," "an embodiment," or "embodiments" mean that the feature or features being referred to are included in at least one embodiment of the technology. Separate references to "one embodiment," "an embodiment," or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the technology can include a variety of combinations and/or integrations of the embodiments described herein.

Modular electronic systems and devices may be used within a testing or observation environment to record data. For example, in some embodiments, electronics modules may be included that incorporate a variety of different experiments or testing means. Accordingly, said electronics modules may be incorporated into testing systems to record data relating to the testing environment. In some embodiments, one or more configurable testing submodules may be included, as will be described in further detail below.

Turning first to FIG. 1, a cutaway view of an exemplary modular electronics system 10 is depicted relating to some embodiments of the invention. In some embodiments, the modular electronics system 10 comprises a housing 12, as shown. In some embodiments, the housing 12 may include a plurality of slots for increasing airflow and reducing a weight of the housing 12. In some embodiments, the increased airflow prevents overheating of internal components of the system 10. In some embodiments, the system 10 includes a plurality of electronics modules 14, which may be disposed within the housing 12, as shown. In some embodiments, the electronics modules 14 may be vertically stacked within the housing 12, as shown. However, embodiments are contemplated in which different configurations are provided. For example, the electronics modules 14 may be laid out on a horizontal plane and more or fewer electronics modules 14 may be included. Further, embodiments are contemplated in which at least a portion of the housing 12 is transparent such that various internal components of the modular electronics system 10 are visible through the housing 12.

In some embodiments, a power source 16 such as a battery is disposed in the housing 12, as shown. In some such embodiments, the power source 16 may provide electrical power to each of the plurality of electronics modules 14. In some embodiments, an electrical connector 18 may be included for transmitting electricity and electrical communications between the plurality of electronics modules 14 and the power source 16. Alternatively, in some embodiments, a separate battery or power source may be included on each electronics module 14. Further still, in some embodiments, the power source 16 may be external to the system 10.

In some embodiments, a controller or microcontroller may be communicatively coupled to one or more of the electronics modules 14. For example, in some embodiments, said controller may interface with the electrical connector 18 such that electrical communications may be transmitted between the controller and the electronics modules 14. In some such embodiments, the controller may comprise a microcontroller 26 disposed on one of the electronics modules 14, as will be described in further detail below.

Figure 2:
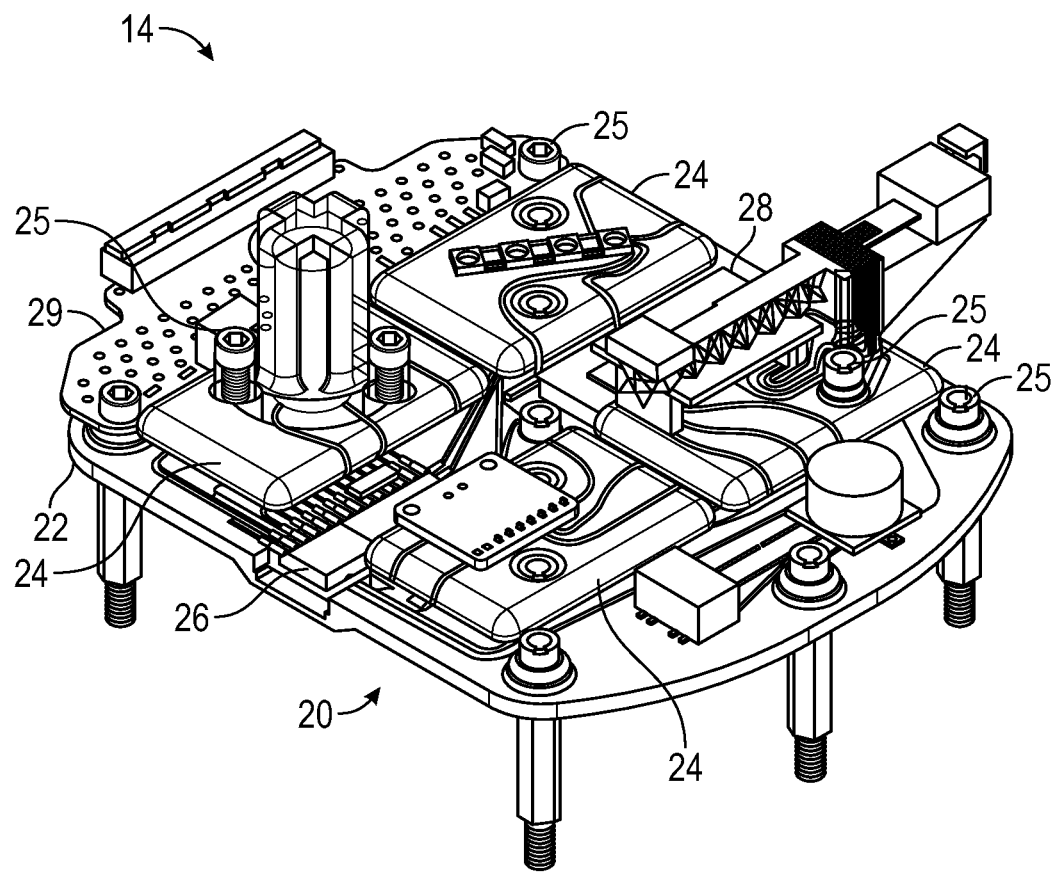
FIG. 2 depicts an exemplary electronics module relating to some embodiments of the invention.

Turning now to FIG. 2, an exemplary electronics module 14 is depicted relating to some embodiments of the invention. In some embodiments, the electronics module 14 may be included individually as a standalone module. Alternatively, in some embodiments, the module 14 may be included as part of a plurality of modules, as shown with respect to FIG. 1. In some embodiments, the electronics module 14 comprises a raceway 20 including a base structure 22. In some embodiments, one or more submodules 24 are mounted onto the base structure 22, as shown. In some embodiments, the submodules 24 may be mounted onto the raceway 20 using one or more bolts 25, as shown. However, in some embodiments, alternative attachment means may be used. For example, embodiments are contemplated in which the submodules 24 may be soldered or adhered onto a top surface of the base structure 22. In some embodiments, bolts 25 may also be used to mount the electronics module 14 in place. For example, the bolts 25 may be used to mount the electronics module 14 within the housing 12, as shown in FIG. 1. Additionally, in some embodiments, the module 14 comprises a microcontroller 26 and a data storage component 28 or a pocket for receiving a data storage component such as a Secure Digital (SD) card or another suitable type of removable storage device.

In some embodiments, the base structure 22 comprises a planar structure, as shown. In some embodiments, the base structure 22 may be additively manufactured using a 3D printing process such as for example, a stereolithography (SLA) process or selective laser sintering (SLS) process. In some embodiments, at least a portion of each submodule 24 may also be created using an SLA process. In some embodiments, the SLA process minimizes the total amount of material used to generate the electronics module 14. Further, in some embodiments, the SLA process allows parts with complex geometries to be produced which would be difficult or even impossible using subtractive manufacturing techniques. In some embodiments, the base structure 22 may be printed with a Polyetherketoneketone (PEKK) material, which is a thermoplastic material having mechanical and chemical properties suitable for the SLA process. In some embodiments, the PEKK material is selected based on the materials relatively low weight per strength properties. In some embodiments, the base structure 22 may include metals, such as titanium, in addition to a polymer material.

In some embodiments, the electronics module 14 further comprises an external printed circuit board (PCB) 29, as shown. In some embodiments, the PCB 29 may be used to provide electrical power to components of the module 14. Additionally, in some embodiments, the PCB 29 may be operable to transmit communications between modules. For example, in some embodiments, the PCB 29 of each module 14 may interface with the electrical connector 18 of the system 10 to provide an electrical communication path between the modules 14 or to route electrical power from the power source 16 to each of the modules 14.

In some embodiments, the microcontroller 26 comprises a Universal Serial Bus (USB) connection port. Accordingly, the microcontroller 26 may be disposed on an edge of the raceway 20 such that the USB port is accessible. Here, an external USB device may interface with the microcontroller 26 through the USB connection port. For example, a USB device may be plugged in to the microcontroller 26 to set and change operating parameters of the microcontroller 26.

Figure 3:
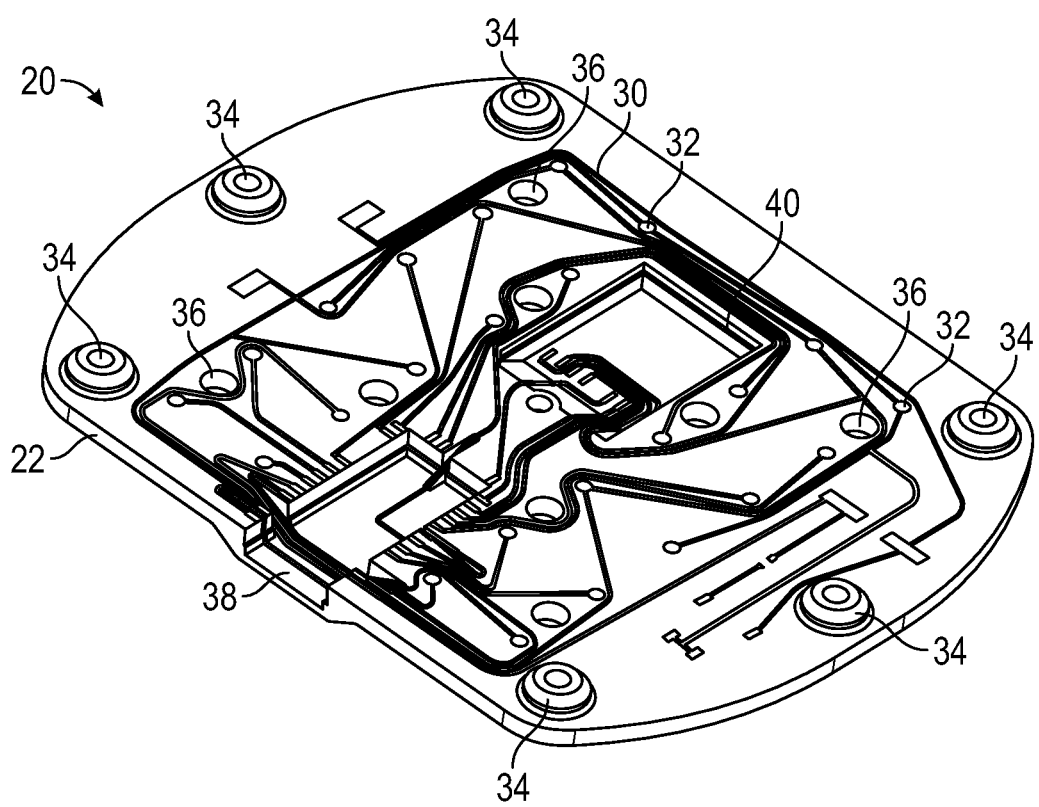
FIG. 3 depicts an exemplary raceway relating to some embodiments of the invention.

Turning now to FIG. 3, the raceway 20 of the electronics module 14 is shown relating to some embodiments of the invention. Here, the raceway 20 is shown with the submodules 24, microcontroller 26, and data storage component 28 removed such that the components of the raceway 20 are easily visible. In some embodiments, the raceway 20 comprises the base structure 22, as shown. In some embodiments, the raceway 20 further comprises one or more conductive traces 30 disposed over a top surface of the base structure 22 and a plurality of connection pads 32 disposed on the base structure 22, as shown. In some embodiments, the conductive traces 30 are applied to the base structure 22 using a laser direct structuring (LDS) process followed by an electroless plating process, as will be described in further detail below. In some embodiments, each of the connection pads 32 comprises a detent portion. Further, in some embodiments, the connection pads 32 may be applied to the surface of the base structure 22 along with the conductive traces 30 using the LDS process and the electroless plating process.

In some embodiments, the conductive traces 30 are configured to provide one or more electrical paths between any combination of the submodules 24, the microcontroller 26, the data storage component 28, or the PCB 29. In some such embodiments, said one or more electrical paths may provide a path to transmit electrical power or electrical communications. In some embodiments, the connection pads 32 provide electrical connections between the conductive traces 30 and each submodule 24, as will be described in further detail below.

In some embodiments, the raceway 20 further comprises a plurality of spaced holes 34 for receiving bolts or other fasteners for mounting the base structure 22 of the raceway 20 in place. In some embodiments, the spaced holes 34 may be raised or vertically spaced, as shown. In some embodiments, the raceway 20 may be mounted into a system comprising a plurality of electronics modules 14 such as the system 10, as shown in FIG. 1. For example, in some embodiments, the spaced holes 34 may be used to receive a bolt such as bolt 25, as shown in FIG. 2, for mounting the electronics module 14 within the housing 12. In some embodiments, the raceway 20 further comprises a plurality of through-holes 36 extending through the base structure 22, as shown. In some embodiments, the through-holes 36 may be used to mount the submodules 24 onto the base structure 22. For example, in some embodiments, a bolt may be placed through the submodule 24 and the through-hole 36 to secure the respective submodule 24 to the base structure 22. Further, in some embodiments, each of the through-holes 36 includes a threaded portion configured to interface with a thread of said bolt fasteners. Alternatively, in some embodiments, the through-holes 36 do not include a threaded portion. Instead, a fastening nut may be disposed on an end of the bolt 25 for tightening the connection of the submodule 24 and the base structure 22.

In some embodiments, the through-holes 36 may be oriented in a specific pattern on the base structure 22. For example, in some embodiments, the through-holes 36 may be arranged in an X-shape, as shown, extending outwardly from a center of the raceway 20. In some embodiments, the X-shape arrangement allows the submodules 24 to have a set orientation with respect to the raceway 20.

In some embodiments, the raceway 20 further comprises a first cutaway portion 38 which is slotted out from the top surface of the base structure 22, as shown, for receiving the microcontroller 26. In some embodiments, the raceway 20 further comprises a second cutaway portion 40 which is slotted out from the top surface of the base structure 22, as shown, for receiving the data storage component 28. For example, in some embodiments, the second cutaway portion 40 comprises an SD card port configured to removably receive an SD card. In some embodiments, the data storage component 28 may be used to store data collected using one or more of the submodules 24.

Figure 4A:
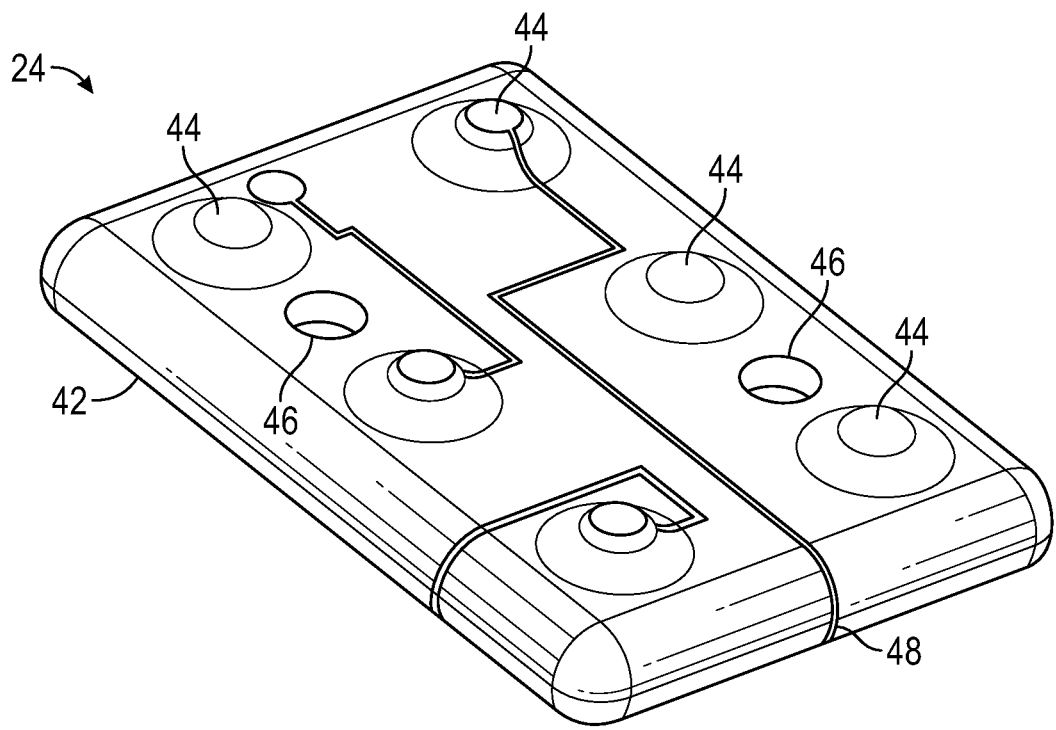
FIG. 4A depicts a bottom view of an exemplary submodule relating to some embodiments of the invention.

Turning now to FIG. 4A, an exemplary submodule 24 is depicted showing a bottom side of the submodule 24, which relates to some embodiments of the invention. In some embodiments, the submodule 24 comprises a submodule base structure 42, a plurality of connection nodes 44, one or more mounting holes 46, and one or more submodule conductive traces 48, as shown. In some embodiments, each of the plurality of connection nodes 44 is configured to interface with a respective connection pad 32 of the raceway 20 by fitting into a detent portion of the respective connection pad 32. Further, in some embodiments, the connection nodes 44 may be soldered to the connection pads 32 for maintaining a continuous electrical connection. Alternatively, in some embodiments, a continuous electrical connection may be maintained without soldering. For example, each of the connection nodes 44 and the connection pads 32 may be formed by or coated with an electrically conductive material such as copper such that a continuous electrical connection is established when the submodules 24 are mounted onto the raceway 20. In some embodiments, the plurality of connection nodes 44 provides a transmission path for power and data between the respective submodule 24 and the connection pads 32 of the raceway 20. In some embodiments, the mounting holes 46 of the submodule 24 are configured to receive bolts 25 or other fasteners for securing the submodule 24 to the base structure 22. For example, a bolt 25 may be placed through the mounting hole 46 and the through-hole 36. In some embodiments, a fastening nut may be disposed on an end of said bolt 25 to tighten the bolt 25 to the base structure 22.

In some embodiments, the through-holes 36 of the raceway 20 and the mounting holes 46 of the submodule 24 are positioned such that when the submodule 24 is mounted onto the raceway 20, the connection nodes 44 of the submodule 24 come into contact with the connection pads 32 of the raceway 20. Accordingly, an electrical connection may be established between each of the connection nodes 44 and each respective connection pad 32. Said electrical connection may be used to provide electrical power to the respective submodule 24 or to provide an electrical path for an electrical signal transmitted to or from the submodule 24. For example, in some embodiments, the submodule 24 may be configured to record a data signal which is transmitted between a node 44 of the submodule through a connection pad 32 of the raceway 20 and into a conductive trace 30 of the raceway 20. In some embodiments, said electrical signal may be transmitted to either or both of the microcontroller 26 or the data storage component 28.

Figure 4B:
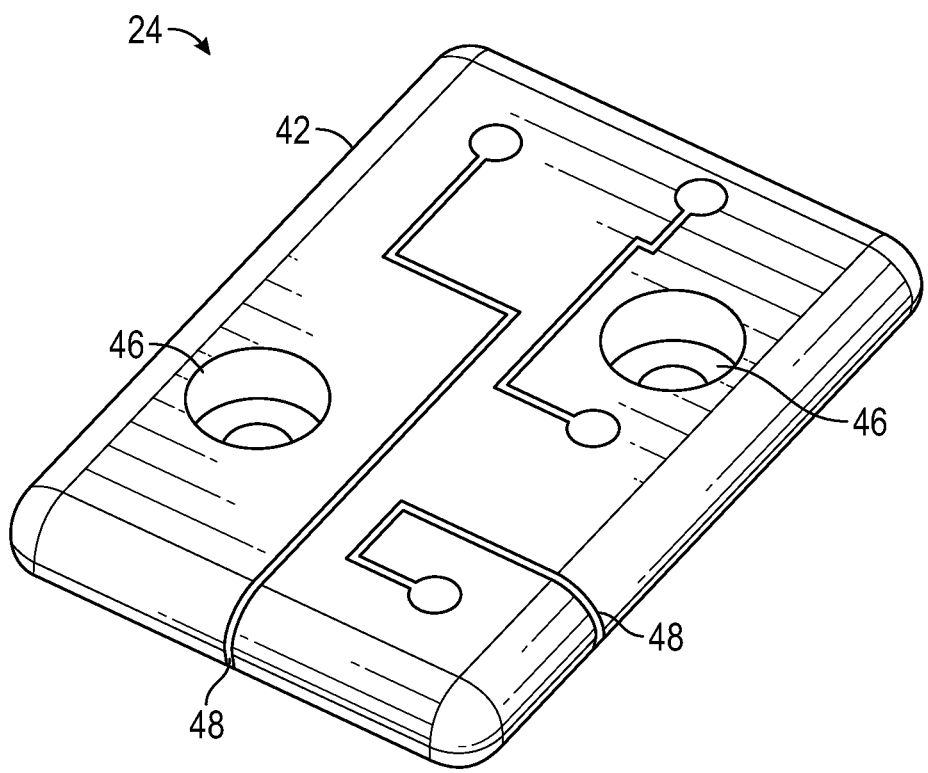
FIG. 4B depicts a top view of an exemplary submodule relating to some embodiments of the invention.

Turning now to FIG. 4B, the exemplary submodule 24 is depicted showing a top side of the submodule 24, which relates to some embodiments of the invention. The submodule 24 comprises the submodule base structure 42, the mounting holes 46, and the submodule conductive traces 48, as shown. In some embodiments, each of the mounting holes 46 may comprise a countersink or counterbore, as shown, such that a top surface of the bolt 25, when assembled, may be flush with or positioned below a top surface of the submodule 24. In some embodiments, the submodule conductive trace 48 may be applied using a similar LDS process and electroless plating process, as described above with respect to the conductive trace 30.

In some embodiments, any number of different subcomponents may be included on each submodule 24 mounted thereon. For example, in some embodiments, said subcomponents may comprise a strain gauge, LED, thermocouple, or accelerometer, as will be described in further detail below, as well as other types of subcomponents for data recording or other electronics functionality. In some embodiments, the subcomponents may be mounted onto the submodule base structure 42 by bolting or soldering onto the submodule conductive trace 48.

Figure 5:
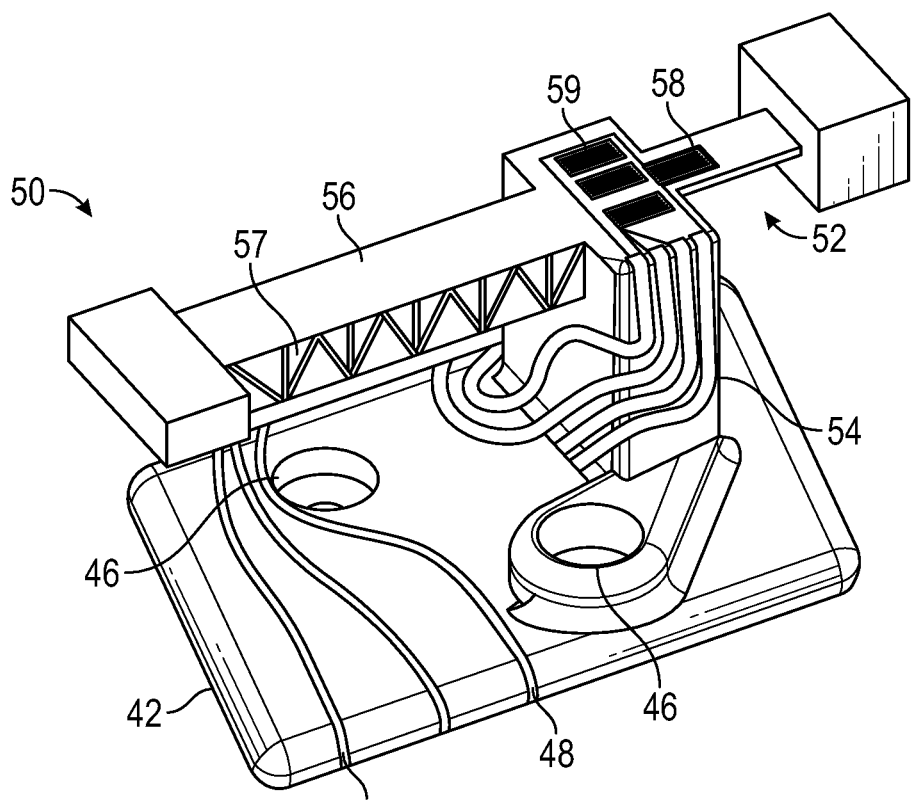
FIG. 5 depicts an exemplary strain gauge submodule relating to some embodiments of the invention.

Turning now to FIG. 5, an exemplary strain gauge submodule 50 is depicted relating to some embodiments of the invention. Here, the strain gauge submodule 50 may comprise each of the components described above with respect to the submodule 24 such as the submodule base structure 42, the connection nodes 44, the mounting holes 46, and the submodule conductive traces 48. In some embodiments, the strain gauge submodule 50 comprises a strain gauge assembly 52, as shown, including a strain gauge base 54, a cantilever beam 56, and one or more strain gauge sensors 58. In some such embodiments, the strain gauge base 54 is configured to be mounted onto a top surface of the submodule base structure 42. Accordingly, the strain gauge base 54 may include a hole for receiving a bolt 25 or other fastener that secures the strain gauge assembly 52 to the submodule base structure 42. As such, in some embodiments, said hole of the strain gauge base 54 may be aligned with one of the mounting holes 46 of the strain gauge submodule 50, as shown.

In some embodiments, the cantilever beam 56 may comprise a lattice structure 57, as shown, which, in some embodiments, is configured to absorb vibrations within the strain gauge assembly 52. In some embodiments, the lattice structure 57 may comprise a reduced density volume without forfeiting structural integrity. Accordingly, the lattice structure 57 may provide structural support without substantially increasing the weight of the overall strain gauge assembly 52. In some embodiments, the lattice structure 57 may be formed based on an octet truss unit cell. Alternatively, other types of lattice structures are also contemplated based around different unit cells, for example, a simple cubic unit cell, tetragonal unit cell, or even more complex unit cells. In some embodiments, the lattice structure 57 is further configured to support the cantilever beam 56. In some embodiments, the cantilever beam 56 with the support of the lattice structure 57 is configured to provide a maximum deflection without structural failure. For example, in some embodiments, the support provided by the lattice structure 57 allows the cantilever beam 56 to flex in either direction without breaking such that relatively large strains may be measured. In some embodiments, a portion of the strain gauge assembly 52 may be formed using a 3D printing process. For example, in some embodiments, the strain gauge base 54 and the cantilever beam 56 including the lattice structure 57 are 3D printed, such as out of a titanium material. In some embodiments, the strain gauge assembly 52 may be secured to the submodule base structure 42 using an epoxy or other type of suitable adhesive.

In some embodiments, a single strain gauge sensor 58 may be included within the strain gauge assembly 52. In some such embodiments, the strain gauge sensor 58 may be arranged into a Wheatstone bridge circuit along with a plurality of resistors 59, as shown. Here, the resistors 59 may be selected such that each resistor 59 provides an electrical resistance similar to an initial resistance of the strain gauge sensor 58. Alternatively, in some embodiments, a plurality of strain gauge sensors 58 may be included. In some embodiments, each of the one or more strain gauge sensors 58 and the resistors are 3D printed directly onto a top surface of the strain gauge base 54, as shown. In some embodiments, any combination of LDS and aerosol jet processes may be used to generate the strain gauge sensor 58.

In some embodiments, a portion of the strain gauge assembly 52 may interface with the submodule conductive traces 48. For example, in some embodiments, an electrical connection portion of the strain gauge assembly 52 is soldered or otherwise electrically connected to a respective submodule conductive trace 48. Accordingly, the sensed strain or an electrical signal indicative of the sensed strain from the strain gauge sensor 58 may be communicated to the submodule conductive traces 48. In some embodiments, said electrical signal indicative of the sensed strain may then be communicated to the connection pads 32 and the conductive trace 30 of the electronics module 14 through one or more nodes of the plurality of connection nodes 44.

Embodiments are contemplated in which different types of strain gauge assemblies are contemplated. For example, in some embodiments, the strain gauge submodule 50 may include a strain gauge without the cantilever beam 56 and/or without the strain gauge base 54. Here, the strain gauge sensor 58 may be disposed directly onto the submodule base structure 42 or onto a breakout board. In some such embodiments, the strain gauge sensor 58 may be 3D printed onto the submodule base structure 42 using any suitable printing technique described herein.

Figure 6:
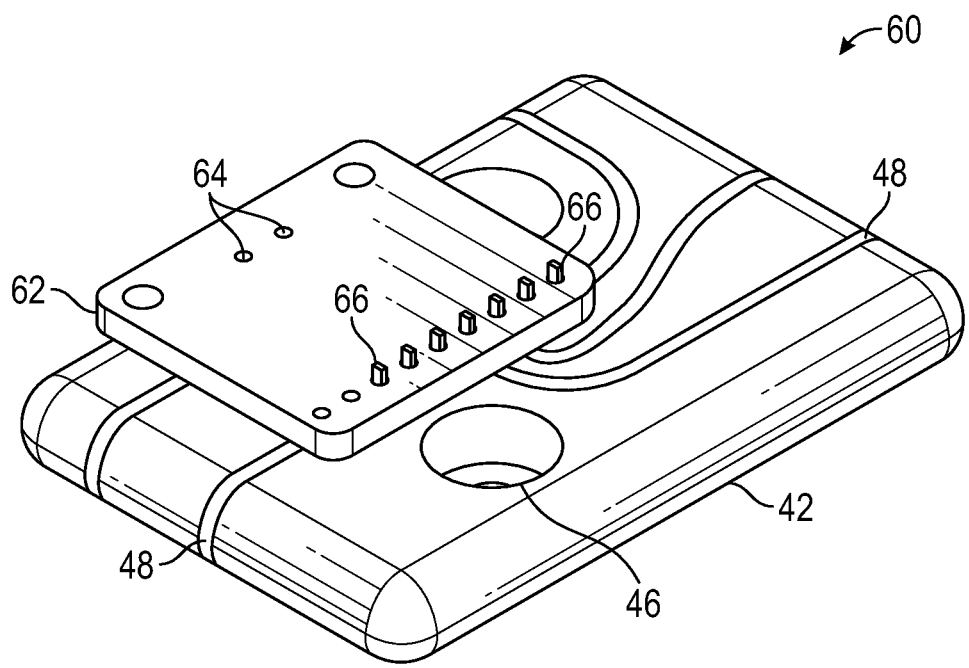
FIG. 6 depicts an exemplary thermocouple submodule relating to some embodiments of the invention.

Turning now to FIG. 6, an exemplary thermocouple submodule 60 is depicted relating to some embodiments of the invention. In some embodiments, the thermocouple submodule 60 comprises a breakout board 62, as shown. In some such embodiments, the breakout board 62 may comprise a PCB or breadboard for supporting various electrical components. In some embodiments, one or more thermocouple ports 64 are disposed on or within the breakout board 62, as shown, for receiving a thermocouple device. Additionally, in some embodiments, the breakout board 62 further comprises a plurality of prongs 66 which may extend through a thickness of the breakout board 62, as shown. In some such embodiments, the prongs 66 may be used to receive and/or transmit electrical signals or power with the submodule conductive traces 48 of the thermocouple submodule 60.

Figure 7:
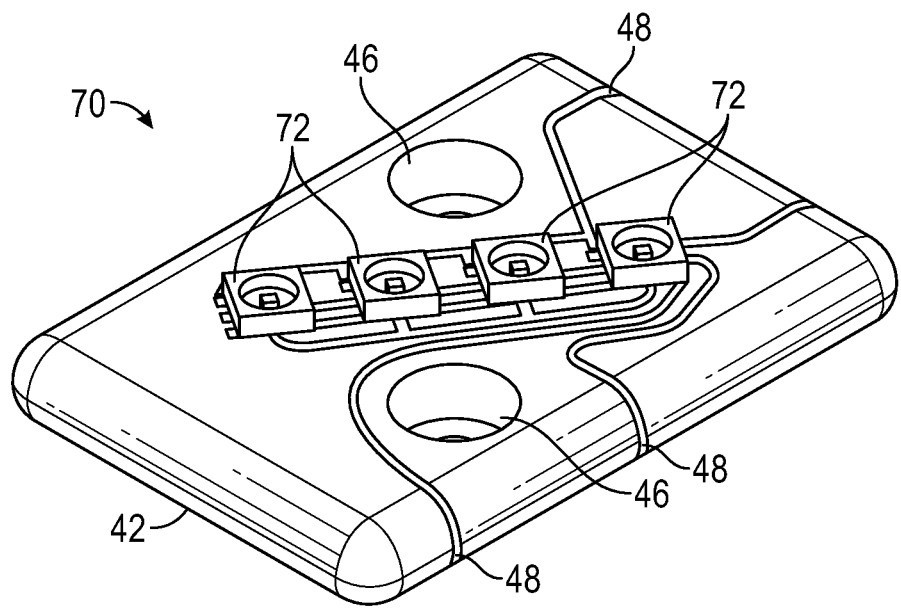
FIG. 7 depicts an exemplary light emitting diode submodule relating to some embodiments of the invention.

Turning now to FIG. 7, an exemplary light emitting diode (LED) submodule 70 is depicted relating to some embodiments of the invention. In some embodiments, the LED submodule 70 comprises one or more LED indicators 72 disposed on a top surface of the submodule base structure 42, as shown. In some such embodiments, each of the LED indicators 72 comprises a multicolor LED which may emit light of a specific color based on a received electrical signal. Accordingly, the LED indicators 72 may be used, for example, to indicate a sensor change/status, a connection of the electronics module 14, an error indication, or another type of connection. It should be understood that the LED indicators 72 may be used to indicate a variety of other changes or connections that are not explicitly described herein. In some embodiments, one or more of the LED indicators 72 may be configured to emit a specific predetermined frequency of light based on a signal received from the microcontroller 26. Further, in some embodiments, the LED indicators 72 may be configured to indicate whether the LED submodule 70 has electrical power or is properly connected to the raceway 20. For example, in some embodiments, an LED indicator 72 may be configured to emit a green light if the LED submodule 70 has power and is properly connected to the raceway 20. Conversely, the LED indicator 72 may emit a red light if the LED submodule 70 has power but is not properly connected to the raceway 20.

In some embodiments, the LED indicators 72 may emit light based on one or more other submodules 24 of the electronics module 14. For example, in some embodiments, an LED indicator 72 of the LED submodule 70 may light up to indicate whether another submodule 24 is properly connected or is currently collecting data. Accordingly, the LED indicators 72 may be used to diagnose various issues within the electronics module 14.

In some embodiments, the LED indicators 72 may be disposed on other types of submodules, such as, for example, on the strain gauge submodule 50 or the thermocouple submodule 60 for indicating whether each submodule is properly connected. Further, in some embodiments, an LED indicator 72 may be configured to light up or change color while the submodule is recording data so it can be easily determined whether the submodule is working. Accordingly, in some such embodiments, the housing 12 may be at least partially transparent such that the LED indicators 72 are visible through the housing 12. Here, an operator may be able to see the LED indicators 72 which are disposed internally to the system 10. Alternatively, in some embodiments, the housing 12 may include a viewing window or opening for viewing the LED indicators 72.

Figure 8A:
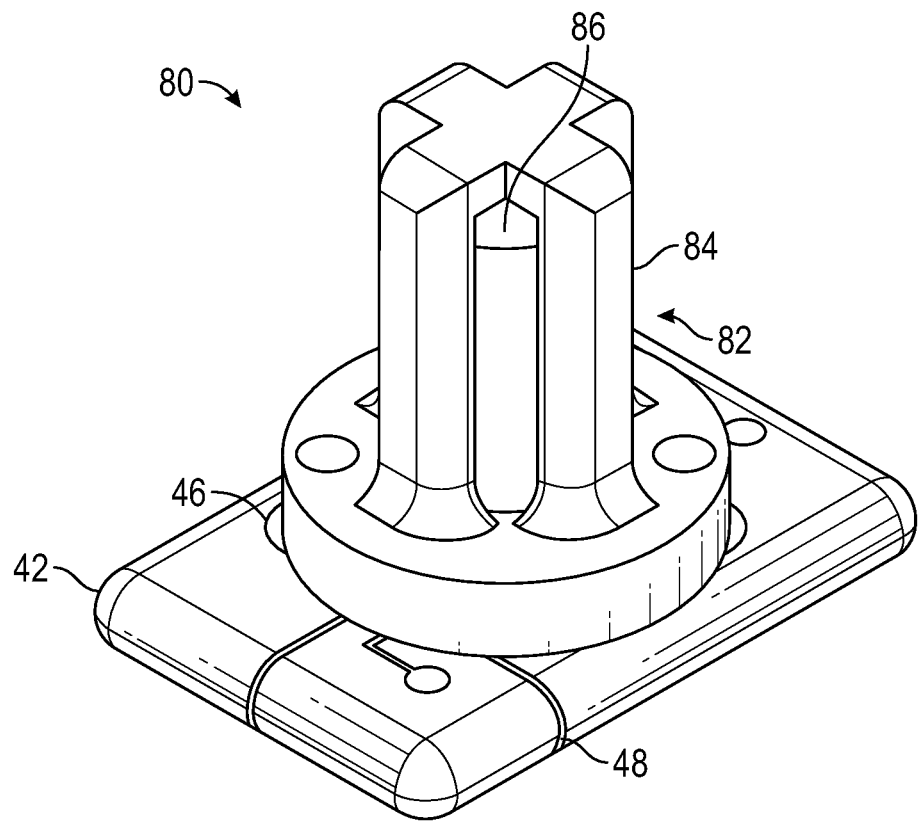
FIG. 8A depicts an exemplary accelerometer submodule relating to some embodiments of the invention.

Turning now to FIG. 8A, an exemplary accelerometer submodule 80 is depicted relating to some embodiments of the invention. In some embodiments, the accelerometer submodule 80 comprises an accelerometer assembly 82 disposed on the top surface of the submodule base structure 42, as shown. In some embodiments, the accelerometer assembly 82 includes an accelerometer housing 84 and an accelerometer weight 86 supported within the accelerometer housing 84. In some embodiments, the accelerometer housing 84 may be secured to the submodule base structure 42, as shown. In some embodiments, the accelerometer housing 84 may include one or more holes for receiving bolts. For example, in some embodiments, the holes may be positioned such that the same bolts may be used to secure the accelerometer assembly 82 to the submodule base structure 42 and to secure the submodule base structure 42 to the raceway 20 of the electronics module 14.

Figure 8B:
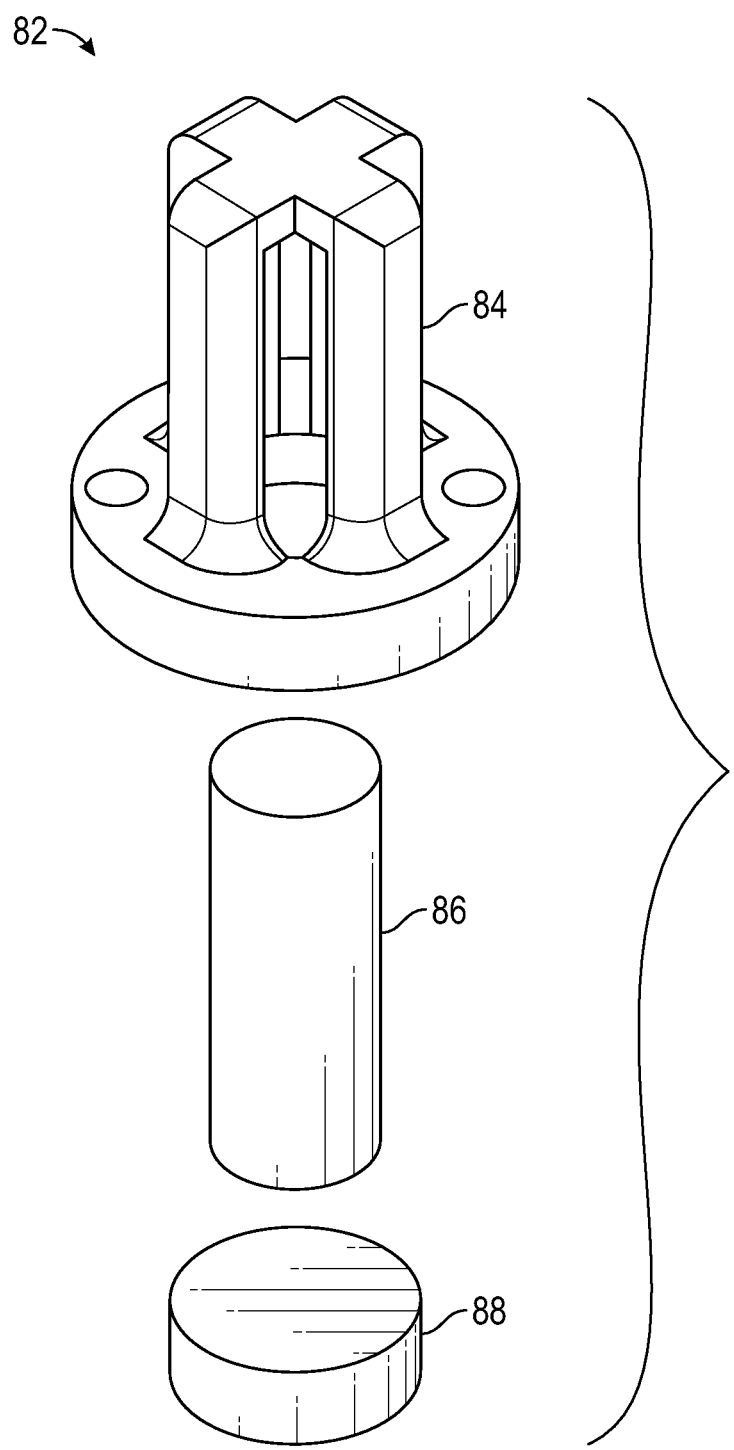
FIG. 8B depicts an exploded view of an accelerometer assembly relating to some embodiments of the invention.

Turning now to FIG. 8B an exploded view of the accelerometer assembly 82 is depicted relating to some embodiments of the invention. In some embodiments, the accelerometer assembly 82 further comprises an acceleration sensor 88 disposed in the accelerometer housing 84 beneath the accelerometer weight 86 for sensing an acceleration of the electronics module 14. Accordingly, during operation when the accelerometer weight 86 is displaced from an acceleration of the electronics module 14 the accelerometer weight 86 causes the acceleration sensor 88 to deflect. In some such embodiments, the deflection of the acceleration sensor 88 may be used to measure the acceleration of the electronics module 14, as will be described in further detail below.

In some embodiments, the accelerometer housing 84 may be formed using a selective laser ablation process. Accordingly, the accelerometer housing 84 may comprise a nylon material. In some embodiments, the accelerometer weight 86 may be formed out of a tungsten material using a fused deposition modeling process. In some embodiments, the acceleration sensor 88 may comprise a piezo-resistive sensor. Said piezo-resistive sensor may be formed using a direct ink writing process. For example, the piezo-resistive sensor may be printed directly onto a surface of the submodule base structure 42 or onto a surface of the accelerometer housing 84. In some embodiments, the acceleration sensor 88 comprises a piezo-resistive siloxane pad which may be 3D printed. Said piezo-resistive siloxane pad is configured such that the electrical resistance of the pad changes with acceleration. In some embodiments, an electrical resistance of the siloxane pad changes based on a displacement of the pad which is imparted by the accelerometer weight 86 from an acceleration. Accordingly, the change in electrical resistance may be correlated to the acceleration using a predetermined correlation factor, which may be experimentally calculated.

Figure 9:
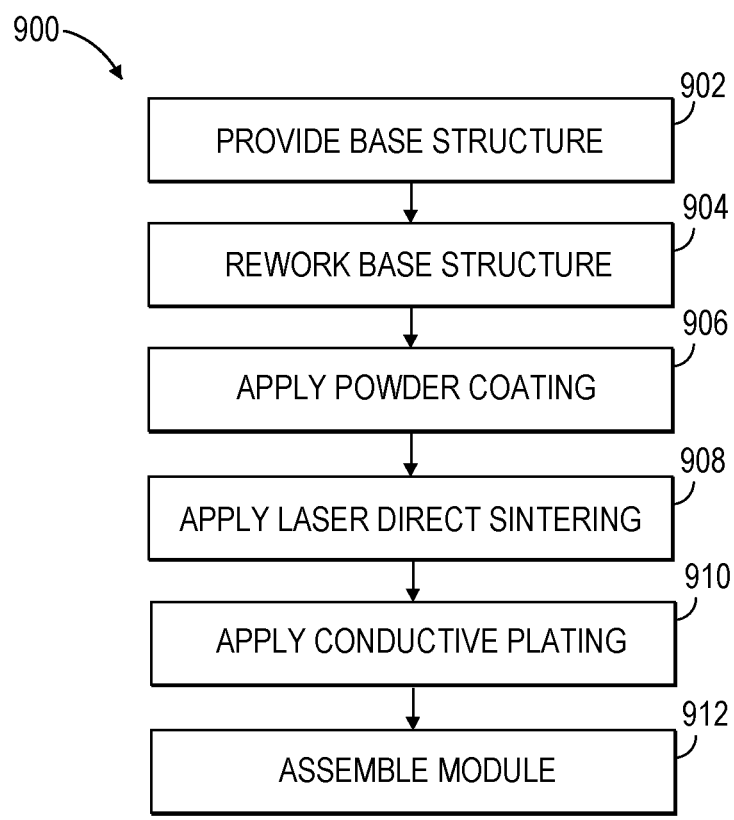
FIG. 9 depicts an exemplary method for providing an electronics module relating to some embodiments of the invention.

Turning now to FIG. 9, an exemplary method 900 for providing the electronics module 14 is depicted relating to some embodiments of the invention. At step 902, the base structure 22 is provided using a 3D printing or other suitable additive manufacturing technique. In some embodiments, the base structure 22 may be formed of a PEKK material, as described above. In some embodiments, the submodule base structure 42 may be provided in a similar fashion as described herein with respect to the base structure 22. In some embodiments, at least a portion of the base structure 22 is reworked at step 904. In some embodiments, the reworking includes adding details not included in the initial 3D printing. Further, in some embodiments, portions of the base structure 22 may be sanded or receive some other type of surface finish.

At step 906, a powder coating is applied to the base structure 22. In some embodiments, the powder coating is selected based on a compatibility of the powder coating with LDS. For example, in some embodiments, a material of the powder coating may have electrical properties that are compatible with the LDS process. Accordingly, the base structure 22 may be formed of materials which are incompatible with the LDS process such as mixed metal and polymer materials or PEKK, as described above. Here, the powder coating may be applied to increase the compatibility with the LDS process of the otherwise incompatible materials.

At step 908, an LDS process is applied to the base structure 22. In some embodiments, the LDS process includes using a laser to write a course on the surface of the base structure 22, which will later become the conductive trace 30 and connection pads 32. In some embodiments, a predefined laser path may be used that is configured to generate the desired positioning of the conductive trace 30 and the connection pads 32 of the raceway 20. As described above, laser course may be applied over the powder coating applied at step 906.

At step 910, a conductive plating is applied over the base structure 22. In some embodiments, the conductive plating is applied to a portion of the base structure 22 that received the LDS. For example, the conductive plating may be formed precisely over the course defined by the LDS process. In some embodiments, the conductive plating may be applied using an electroless plating process. Accordingly, the plating may only adhere to the written course from the LDS process. In some embodiments, a conductive material may be used for the conductive plating such as, for example, copper or a copper alloy. In some embodiments, the conductive plating forms the conductive traces 30 and the connection pads 32 of the raceway 20. In some such embodiments, the conductive plating is compatible with a soldering process that may be used to mount and secure various other components to the raceway 20, such as the submodules 24, in addition to providing an electrical connection to said components. In some embodiments, the conductive plating is also applied to one or more of the submodules 24 to form the submodule conductive traces 48 and the connection nodes 44.

At step 912, the electronics module 14 is assembled. In some embodiments, the electronics module 14 is assembled by soldering one or more submodules 24 onto the raceway 20, for example, including any combination of the strain gauge submodule 50, the thermocouple submodule 60, the LED submodule 70, or the accelerometer submodule 80. Alternatively, in some embodiments, the submodules 24 are bolted onto the raceway 20 or fastened to the raceway 20 in some other suitable way. Further, embodiments are contemplated in which any combination of soldering and bolting or other means of fastening are used to assembly the electronics module 14. In some embodiments, the submodules 24 may be removably attached to the raceway 20 such that the submodules 24 may be swapped out and replaced periodically with different submodules 24. Further still, embodiments are contemplated in which an adhesive may be used to assemble either or both of the electronics module 14 and the submodules 24. In some embodiments, components of the submodules 24 may be glued onto the submodule base structure 42. For example, the strain gauge assembly 52 may be secured to the submodule base structure 42 by gluing the strain gauge base 54 onto a top surface of the submodule base structure 42.

In some embodiments, each of the submodules 24 may be manufactured using similar steps as described above with respect to method 900. For example, in some embodiments, a powder coating, LDS, and conductive plating may be applied to each submodule 24. In some embodiments, each of the submodules 24 may be assembled individually before mounting onto the raceway 20. Similar to as described above with respect to the electronics module 14, components of the submodules 24 may be soldered or fastened to the submodule base structure 42.

In some embodiments, the modular electronics system 10 described herein may be configured to mount onto a testing structure or component within an experiment. For example, the modular electronics system 10 may be secured to or mounted within a mobile object such as a vehicle or projectile to record various data relating to the path and environment of the respective object. For example, the accelerometer submodule 80 may record an acceleration of the object during flight, while the thermocouple submodule 60 records an ambient temperature.

Although the invention has been described with reference to the embodiments illustrated in the attached drawing figures, it is noted that equivalents may be employed and substitutions made herein without departing from the scope of the invention as recited in the claims.

Having thus described various embodiments of the invention, what is claimed as new and desired to be protected by Letters Patent includes the following:

1. An electronics module comprising: a raceway comprising: a base structure; one or more conductive traces disposed on the base structure; and a plurality of connection points disposed on the base structure; and one or more submodules mounted onto the raceway, each submodule of the one or more submodules comprising: a submodule base structure; and a plurality of connection nodes disposed on a surface of the submodule base structure configured to interface with the plurality of connection points of the raceway respectively, wherein the one or more conductive traces are applied to the base structure by additive manufacturing, and wherein each connection point of the plurality of connection points comprises a detent portion configured to receive a respective connection node of the plurality of connection nodes and wherein each of the plurality of connection nodes provides a continuous electrical connection with the respective connection point of the plurality of connection points.

2. The electronics module of claim 1, wherein the one or more submodules comprises an accelerometer submodule comprising: an accelerometer housing; an accelerometer weight disposed in the accelerometer housing; and an accelerometer sensor that indicates an acceleration responsive to motion of the accelerometer weight.

3. The electronics module of claim 2, wherein the accelerometer sensor comprises a piezo-resistive sensor.

4. The electronics module of claim 3, wherein the piezo-resistive sensor is printed via a direct ink write process.

5. The electronics module of claim 4, wherein the accelerometer housing is printed using a selective laser ablation process and comprises a nylon material.

6. The electronics module of claim 5, wherein the accelerometer weight comprises a tungsten loaded nylon cylinder formed by a fused deposition modeling process.

7. An electronics system comprising: one or more electronics modules comprising: a raceway including: a base structure; one or more conductive traces on the base structure, said one or more conductive traces; and a plurality of connection pads disposed on the base structure, each connection pad of the plurality of connection pads comprising a detent portion; one or more submodules mounted onto the raceway, each submodule of the one or more submodules comprising: a submodule base structure; and a plurality of connection nodes disposed on a first side of the submodule base structure configured to interface with the plurality of connection pads of the raceway respectively by fitting into the detent portion of each connection pad; and at least one microcontroller communicatively coupled to the one or more electronics modules.

8. The electronics system of claim 7, wherein at least a portion of the raceway is additively manufactured.

9. The electronics system of claim 7, wherein the one or more submodules comprises: a strain gauge submodule comprising one or more strain gauge sensors configured to detect a strain associated with the electronics system.

10. The electronics system of claim 9, wherein the strain gauge submodule further comprises: a strain gauge base; and a cantilever beam mounted to the strain gauge base.

11. The electronics system of claim 7, wherein the one or more submodules comprises: a Light Emitting Diode (LED) submodule comprising one or more LED indicators electrically coupled to the one or more conductive traces on the base structure.

12. The electronics system of claim 11, wherein the one or more LED indicators are configured to illuminate responsive to a status of the electronics system.

13. An electronics module comprising: a raceway comprising: a base structure; one or more conductive traces disposed on the base structure; and a plurality of connection points disposed on the base structure; and an accelerometer submodule mounted onto the raceway, the accelerometer submodule comprising: a submodule base structure; an accelerometer housing; an accelerometer weight disposed in the accelerometer housing; an accelerometer sensor that indicates an acceleration responsive to motion of the accelerometer weight; and a plurality of connection nodes disposed on a surface of the submodule base structure configured to interface with the plurality of connection points of the raceway.

14. The electronics module of claim 13, wherein the accelerometer housing is printed using a selective laser ablation process and comprises a nylon material.

15. The electronics module of claim 13, wherein the accelerometer weight comprises a tungsten loaded nylon cylinder formed by a fused deposition modeling process.

16. The electronics module of claim 13, wherein the accelerometer sensor comprises a piezo-resistive sensor that is printed via a direct ink write process.

17. The electronics module of claim 13, further comprising: a strain gauge submodule comprising one or more strain gauge sensors configured to detect a strain associated with the electronics module.

18. The electronics module of claim 17, further comprising: a thermocouple submodule comprising one or more thermocouple sensors configured to detect a temperature associated with the electronics module.

* * * * *